(12) United States Patent
Mukund

(10) Patent No.: US 9,794,678 B2
(45) Date of Patent: Oct. 17, 2017

(54) PSYCHO-ACOUSTIC NOISE SUPPRESSION

(75) Inventor: Shridhar K Mukund, San Jose, CA (US)

(73) Assignee: Plantronics, Inc., Santa Cruz, CA (US)

(*) Notice: Subject to any disclaimer, the term of this patent is extended or adjusted under 35 U.S.C. 154(b) by 611 days.

(21) Appl. No.: 13/471,423

(22) Filed: May 14, 2012

(65) Prior Publication Data

US 2012/0288125 A1  Nov. 15, 2012
US 2017/0195779 A9  Jul. 6, 2017

Related U.S. Application Data

(60) Provisional application No. 61/486,080, filed on May 13, 2011.

(51) Int. Cl.
*H04R 5/00* (2006.01)
*H04R 1/22* (2006.01)
*H03G 3/32* (2006.01)

(52) U.S. Cl.
CPC ............... *H04R 1/22* (2013.01); *H03G 3/32* (2013.01)

(58) Field of Classification Search
CPC .. H04R 25/552; H04R 25/353; H04R 25/356; H03G 3/32; H03G 3/24; H04S 2420/01
USPC ........................... 381/310, 312, 57
See application file for complete search history.

(56) References Cited

U.S. PATENT DOCUMENTS

| | | | |
|---|---|---|---|
| 3,924,072 A * | 12/1975 | Turner | H04R 5/04 381/1 |
| 5,386,082 A * | 1/1995 | Higashi | G01H 17/00 381/1 |
| 5,590,241 A | 12/1996 | Park et al. | |
| 5,692,059 A | 11/1997 | Kruger | |
| 5,732,390 A | 3/1998 | Katayanagi et al. | |
| 5,933,506 A | 8/1999 | Aoki et al. | |
| 6,978,159 B2 * | 12/2005 | Feng et al. | 455/570 |
| 7,012,630 B2 * | 3/2006 | Curry et al. | 348/14.08 |
| 7,116,787 B2 * | 10/2006 | Faller | 381/17 |
| 7,206,421 B1 * | 4/2007 | Taenzer | 381/119 |
| 7,246,058 B2 | 7/2007 | Burnett | |

(Continued)

FOREIGN PATENT DOCUMENTS

| | | |
|---|---|---|
| EP | 0 637 187 A1 | 2/1995 |
| JP | 2008-271067 A | 11/2008 |
| KR | 10-2010-0072746 A | 7/2010 |

OTHER PUBLICATIONS

International Search Report dated Nov. 16, 2012, in international application No. PCT/US2012/034570, filed Apr. 20, 2012.

*Primary Examiner* — Duc Nguyen
*Assistant Examiner* — Kile Blair

(57) ABSTRACT

A method for perceptual enhancement of a received remote talker's voice, in the presence of local ambient noise, in an electronic voice communication system is provided. The method includes generating a pair of binaural voice signals from the remote talker's voice and manipulating the characteristics of the resulting pair of binaural signals. The two ears of the local listener are stimulated binaurally with the pair of binaural voice signals. The stimulating is performed adaptively as the ambient noise in the local listener's environment changes, thereby creating a perception of remote talker reacting actively to the local ambient noise, in a psycho-acoustically pleasing manner to the local listener.

20 Claims, 2 Drawing Sheets

(56) References Cited

U.S. PATENT DOCUMENTS

| | | | |
|---|---|---|---|
| 7,260,209 B2* | 8/2007 | Harvey | H03G 3/32 379/392.01 |
| 7,343,187 B2 | 3/2008 | Stetson | |
| 7,612,793 B2* | 11/2009 | Potekhin et al. | 348/14.01 |
| 7,796,764 B2* | 9/2010 | Lucioni | 381/17 |
| 7,813,923 B2 | 10/2010 | Acero et al. | |
| 8,045,718 B2* | 10/2011 | Faure et al. | 381/17 |
| 8,180,064 B1* | 5/2012 | Avendano et al. | 381/73.1 |
| 8,374,365 B2* | 2/2013 | Goodwin et al. | 381/310 |
| 2001/0014160 A1* | 8/2001 | Maejima | H04S 1/002 381/23 |
| 2005/0281410 A1 | 12/2005 | Grosvenor et al. | |
| 2007/0160230 A1* | 7/2007 | Nakagomi | H04R 3/005 381/97 |
| 2009/0055170 A1 | 2/2009 | Nagahama | |
| 2010/0202621 A1* | 8/2010 | Murata | H03G 3/32 381/26 |
| 2015/0098571 A1* | 4/2015 | Jarvinen | H04S 7/301 381/1 |

* cited by examiner

PSYCHO-ACOUSTIC NOISE SUPPRESSION

CROSS REFERENCE TO RELATED APPLICATIONS

This application claims priority to U.S. Patent Application No. 61/486,080, filed on May 13, 2011, and entitled "PSYCHO-ACOUSTIC NOISE SUPPRESSION."

BACKGROUND

Recent developments in the art of manufacturing has brought significant reduction in cost and form factor of mobile consumer devices—tablet, blue tooth headset, net book, net TV etc. As a result, there is an explosive growth in consumption of these consumer devices. Besides communication applications such as voice and video telephony, voice driven machine applications are becoming increasing popular as well. Voice based machine applications include voice driven automated attendants, command recognition, speech recognition, voice based search engine, networked games and such. Video conferencing and other display oriented applications require the user to watch the screen from a hand-held distance. In the hand-held mode, the signal to noise ratio of the desired voice signal at the microphone is severely degraded, both due to the exposure to ambient noise and the exposure to loud acoustic echo feedback from the loudspeakers in close proximity. This is further exacerbated by the fact that voice driven applications and improved voice communications require wide band voice.

Binaural headsets, both wired and wireless have been increasing along with the explosive growth of mobile consumer devices. However, the noise environments in which the headsets are used are becoming ever more challenging, especially in the presence of ambient noise in the environment of the listener.

It is within this context that the embodiments arise.

SUMMARY

The embodiments provide take advantage of the observation that the human brain has naturally evolved to perform noise suppression by taking advantage of several cues in the environment. On a lighter note, it is this ability which makes a husband completely miss hearing his wife, while he may be busy watching a TV show.

In the present embodiments, an arbitrary number of microphones are bifurcated into two groups. The microphones in each group are summed together to form two microphone arrays. Due to the computing ease of the processing operation, i.e., summing, these arrays by themselves provide very little improvement of signal to noise ratio in the desired look direction. However, the microphones are arranged such that the characteristics of the ambient noise from other directions orthogonal to the look direction, is substantially different between the outputs of the two microphone arrays. The embodiments employ a source separation adaptive filtering process between these two outputs to generate the desired signal with substantially improved signal to noise ratio. The separation process also provides ambient noise with significantly reduced voice. There are applications where the ambient noise is of use. The outputs of a multiplicity of microphones is reduced or encoded into two signals, i.e., the virtual microphones. With the reduced bandwidth and fixed signal dimension, it is easier to perform the processing through existing hardware and software systems, such that the processing of interest may be performed either on the end hosts or the network cloud.

The above summary does not include all aspects of the present invention. The invention includes all systems and methods disclosed in the Detailed Description below and particularly pointed out in the claims.

BRIEF DESCRIPTION OF THE DRAWINGS

The embodiments of the invention are illustrated by way of examples and not be interpreted by way of limitation in the accompanying drawings.

DETAILED DESCRIPTION

While several details are set forth, it is understood that some embodiments of the invention may be practiced without these details. In some instances, well-known circuits and techniques have not been shown in detail so as not to obscure the understanding of this description.

Active Noise Control has been utilized to generate anti-noise in the ears of the listener. However, active noise control requires a fully-covered headset, making it expensive and inconvenient Implementations which use smaller headsets have not fared well in the quality of enhancement.

Adaptive Volume Control, where the volume of the remote talker's voice is increased in the listener's ears based on the loudness of ambient noise has also been utilized to address this problem. However, this method has a limited useful range in which the volume can be varied without hurting the listener's ears.

Figure 1:
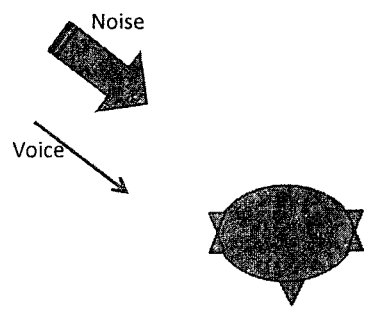
FIG. 1 illustrates noise and voice signals originating from a same direction.
Figure 2:
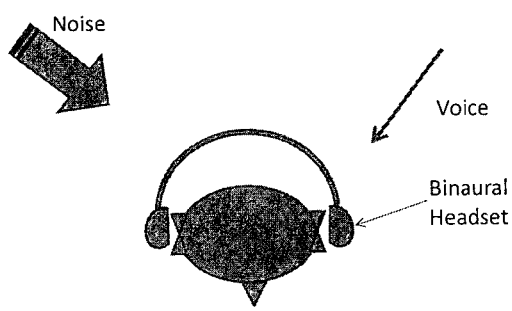
FIG. 2 illustrates noise and voice signals originating from different directions.
Figure 3:
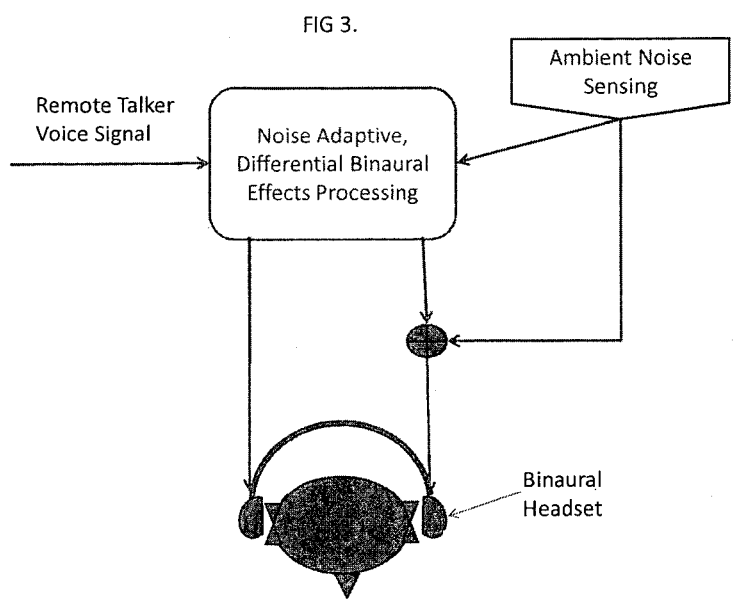
FIG. 3 illustrates a simplified schematic diagram illustrating a technique to excite the ears of a listener with a pair of stereo or binaural signals to create psycho acoustic effects in accordance with one embodiment of the invention.

The following psycho-acoustic observations of interest provide a basis for the embodiments described below:
  a. Human hearing is more sensitized to directional sound as compared to diffused sound coming from all over.
  b. Human hearing can differentiate two sources of sound better if it comes from two different directions as shown in FIG. 2, rather than coming from the same direction as shown in FIG. 1.
  c. Human hearing is more sensitized to a whisper in the ear rather than an equally loud sound from a distance.
  d. Human hearing is sensitized to a shout out from a distance. Shouting makes the voice different—it has the so called Lombard's effect.
  e. Human hearing is sensitized to a moving sound source as compared to a diffused source of sound In the embodiments described above, a plurality of microphones is bifurcated into two groups. As shown in FIG. 3, methods to excite the two ears of the listener with a pair of stereo, or binaural signals, creating the desired psycho-acoustic effects is provided. The effects processing is made adaptive with the ambient noise characteristics such as direction of arrival of the noise and its loudness. The effects include the following:
  Playing the remote talker's voice in the two ears with different delays to create a perception of desired directionality.

Playing the remote talker's voice in the two ears with different attenuation to further support the perception of desired directionality.

Making the diffused ambient noise seem directional by mixing some of the noise sensed from the environment into one of the ears. It should be appreciated that this makes the listener hear the noise more in one of the ears.

Playing the remote talker's voice in the two ears with a phase inversion to create the perception of the voice emanating from within the head of the listener.

Introducing Lombard's effect into the remote talker's voice through signal processing, to create a perception that the remote talker is shouting to keep up with the ambient noise around the listener.

The received remote talker's voice is mono. We make two copies for the left and right channels to be processed and fed to the two speakers of the stereo headset as shown in FIG. 3. Using the local microphones in the device, we sense the ambient noise. There are several ways to sense ambient noise, some described by the authors in other patents. From this sensor, we can determine the intensity and direction of the ambient noise. The two copies of the remote talker's signals are manipulated based on the sensed ambient noise. In one example of the manipulation, we delay the two copies to make it seem to arrive from a direction different from that of the ambient noise. In the event the ambient noise does not have a preferred direction, such as the vase of diffused noise, we artificially make it seem as though it is directional. This is achieved by taking some of the observed noise and adding it towards one of the ears, so the listener is led to believe that the noise is arriving from that direction. In addition, we also propose introducing Lombard's effect, in effect making it sound as though the remote talker's is shouting in response to the ambient noise in the local listener's environment. It should be appreciated that while FIG. 3 illustrates a binaural headset, the same effect can be realized using stereo or surround speaker systems as well.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the invention are useful machine operations. The embodiments also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations The invention can also be embodied as computer readable code on a computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method comprising:
   determining a direction of the ambient noise in an environment of a listener;
   receiving an audio signal, wherein the audio signal represents a remote talker's voice;
   generating a first copy of the audio signal;
   generating a second copy of the audio signal;
   introducing a time delay into the first copy of the audio signal, wherein a magnitude of the time delay is based on the direction of the ambient noise;
   providing the first copy to a first ear of the listener subsequent to introducing the time delay; and
   providing the second copy to a second ear of the listener subsequent to introducing the time delay.

2. The method of claim 1, further comprising:
   providing the first copy to the first ear of the listener, and providing the second copy to the second ear of the listener, through a headset.

3. The method of claim 1, wherein the audio signal is a first audio signal, further comprising:
   receiving a second audio signal from a first microphone located at a first location in the environment of the listener;
   receiving a third audio signal from a second microphone located at a second location in the environment of the listener; and
   determining the direction of the ambient noise in an environment of a listener based on the second and third audio signals.

4. The method of claim 1, further comprising:
   attenuating at least one of the first copy and the second copy prior to providing the first copy and the second copy to the ears of the listener.

5. The method of claim 1, further comprising:
   adding the ambient noise to at least one of the first copy and the second copy prior to providing the first copy and the second copy to the ears of the listener.

6. The method of claim 1, further comprising:
applying a phase inversion to at least one of the first copy and the second copy prior to providing the first copy and the second copy to the ears of the listener.

7. The method of claim 1, further comprising:
applying Lombard's effect to at least one of the first copy and the second copy prior to providing the first copy and the second copy to the ears of the listener.

8. Non-transitory computer-readable media embodying instructions executable by a computer to perform functions comprising:
determining a direction of ambient noise in an environment of a listener;
receiving a first audio signal, wherein the first audio signal represents a remote talker's voice;
generating a first copy of the first audio signal;
generating a second copy of the first audio signal;
introducing a time delay into the first copy of the audio first signal, wherein a magnitude of the time delay is based on the direction of the ambient noise;
causing provision of the first copy to a first ear of the listener subsequent to introducing the time delay; and
causing provision of the second copy to a second ear of the listener subsequent to introducing the time delay.

9. The non-transitory computer-readable media of claim 8, wherein the functions further comprise:
receiving a second audio signal from a first microphone located at a first location in the environment of the listener;
receiving a third audio signal from a second microphone located at a second location in the environment of the listener; and
determining the direction of the ambient noise based on the second and third audio signals.

10. The non-transitory computer-readable media of claim 8, wherein the functions further comprise:
causing attenuation of at least one of the first copy and the second copy prior to causing provision of the first copy and the second copy to the ears of the listener.

11. The non-transitory computer-readable media of claim 8, wherein the functions further comprise:
adding the ambient noise to at least one of the first copy and the second copy prior to causing provision of the first copy and the second copy to the ears of the listener.

12. The non-transitory computer-readable media of claim 8, wherein the functions further comprise:
applying a phase inversion to at least one of the first copy and the second copy prior to causing provision of the first copy and the second copy to the ears of the listener.

13. The non-transitory computer-readable media of claim 8, wherein the functions further comprise:
applying Lombard's effect to at least one of the first copy and the second copy prior to causing provision of the first copy and the second copy to the ears of the listener.

14. An apparatus comprising:
a receiver configured to receive first, second, and third audio signals, wherein the third audio signal represents a remote talker's voice;
a processor configured to
determine a direction of ambient noise ambient noise in an environment of a listener based on the first and second audio signals,
generate a first copy of the third audio signal,
generate a second copy of the third audio signal, and
introduce a time delay into the first copy of the third audio signal, wherein a magnitude of the time delay is based on the direction of the ambient noise;
a first speaker configured to provide the first copy to a first ear of the listener subsequent to the processor introducing the time delay; and
a second speaker configured to provide the second copy to a second ear of the listener subsequent to the processor introducing the time delay.

15. The apparatus of claim 14, further comprising:
a headset, wherein the headset comprises the first and second speakers.

16. The apparatus of claim 14, further comprising:
a first microphone configured to provide the first audio signal; and
a second microphone configured to provide the second audio signal.

17. The apparatus of claim 14, further comprising:
an attenuator configured to attenuate at least one of the first copy and the second copy prior to providing the first copy and the second copy to the ears of the listener.

18. The apparatus of claim 14, further comprising:
an adder configured to add the ambient noise to at least one of the first copy and the second copy prior to providing the first copy and the second copy to the ears of the listener.

19. The apparatus of claim 14, further comprising:
a phase inverter configured to apply a phase inversion to at least one of the first copy and the second copy prior to providing the first copy and the second copy to the ears of the listener.

20. The apparatus of claim 14, wherein:
the processor is further configured to apply Lombard's effect to at least one of the first copy and the second copy prior to providing the first copy and the second copy to the ears of the listener.

* * * * *